United States Patent [19]
Ginetti et al.

[11] Patent Number: 5,896,299
[45] Date of Patent: *Apr. 20, 1999

[54] METHOD AND A SYSTEM FOR FIXING HOLD TIME VIOLATIONS IN HIERARCHICAL DESIGNS

[75] Inventors: Arnold Ginetti, Antibes; François Silve, Le Cannet; Jean-Michel Fernandez, Antibes, all of France

[73] Assignee: VLSI Technology, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/542,869

[22] Filed: Oct. 13, 1995

[51] Int. Cl.⁶ ...................................... G06F 15/00
[52] U.S. Cl. ...................... 364/490; 364/491; 395/558
[58] Field of Search ............................ 395/551, 552, 395/558; 364/488, 489, 490, 491

[56] References Cited

U.S. PATENT DOCUMENTS

| | | | |
|---|---|---|---|
| 5,229,668 | 7/1993 | Hughes, Jr. et al. | 307/605 |
| 5,455,931 | 10/1995 | Camporese et al. | 395/556 |
| 5,638,291 | 6/1997 | Li et al. | 364/490 |
| 5,654,898 | 8/1997 | Roetcisoender et al. | 364/490 |
| 5,774,371 | 6/1998 | Kawakami | 364/491 |

OTHER PUBLICATIONS

K. Keutzer, "DAGON: Technology Binding and Local Optimization by DAG Matching", 24th Design Automation Conference, pp. 341–346 (1987).

A. Ginetti et al (Aramis, Belgium), "Using the Asic Synthesizer in DSP Designs", DSP, The Enabling Technology For Communications, Mar. 9–10, 1993, Amsterdam.

D. Brasen et al, "Post–Placement Technology Mapping", VLSI 93, Sep. 6–10, 1993, Grenoble.

*Primary Examiner*—Dennis M. Butler
*Attorney, Agent, or Firm*—Burns, Doane, Swecker & Mathis LLP

[57] ABSTRACT

The invention relates to a computer implemented process for fixing hold time violations in hierarchical designs of electronic circuits. The process comprises the steps of:

1) synthesizing a RTL-HDL type description of the circuit to form a synthesized design.

2) synthesizing a clock tree and adding it to the synthesized design produced in step 1.

3) optimizing the synthesized design resulting from step 2, and fixing upper-bounded timing constraints by using a real clock timing (latency and skew) and worst case conditions.

4) fixing lower-bounded timing violations in the optimized synthesized design resulting from step 3, using a real clock timing, using best case conditions.

5) re-fixing possible upper-bounded timing constraints newly created and possible upper-bounded timing constraints increased in step 4.

6) fixing post-layout upper-bounded timing violations.

7 Claims, 5 Drawing Sheets

METHOD AND A SYSTEM FOR FIXING HOLD TIME VIOLATIONS IN HIERARCHICAL DESIGNS

TECHNICAL FIELD OF THE INVENTION

This invention relates to a tool for automatically fixing hold time violations in hierarchical designs of electronic circuits. It belongs to an industrial class of logic and RTL synthesis tools.

BACKGROUND OF THE INVENTION

Figure 1A:
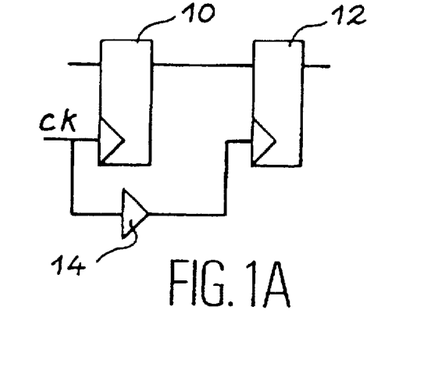
FIG. 1A, above described, is a diagrammatic view of a circuit showing a first example of a hold time violation case due to a clock skew in a shift register, FIG. 1B, above described, shows the circuit of FIG. 1A in which a delay cell has been added in order to fix the hold time violation, FIG. 2A, already described, is a diagrammatic view of a circuit showing another example of a hold time violation case due to a phase difference in a multiphase design, FIG. 2B, above described, shows the circuit of FIG. 2A in which a delay cell has been added in order to fix the hold time violation, FIG. 3A, above described, is a diagrammatic view of a circuit showing another example of a hold time violation case due to a clock latency, FIG. 3B, above described, shows the circuit of FIG. 3A in which a delay cell has been added in order to fix the hold time violation, FIG. 4, above described is a diagrammatic view of a circuit with different paths between two flip-flops, illustrating general knowledge in the domain of "timing constraints", FIGS. 5–12, already described, show time behaviours between flip-flops and also illustrate general knowledge in the domain of time constraints, FIG. 13, diagrammatically shows an hierarchical delay cell synthesized according to the invention.

Hold time violations are to be found in industrial designs for different reasons. For instance, in a shift register, hold time violations occur when the clock skew is bigger than the clock-to-data output pin-to-pin timing of some flip-flops. As an example FIG. 1A shows a shift register comprising two flip-flops 10 and 12. In this FIG. 1A a clock skew is modeled as a delay cell 14.

Figure 2A:
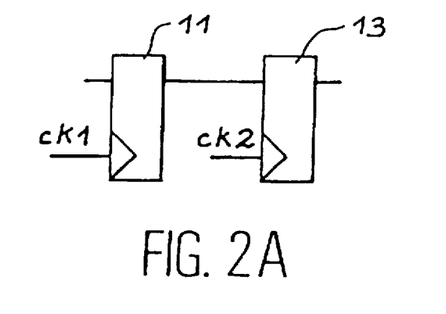
Figure 3A:
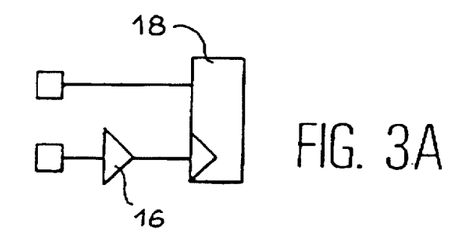

In multiphase designs, hold time violations occur when some phase conditions are not respected between the different clocks. Such a case is shown in FIG. 2A in which two different clock signals $ck_1$ and $ck_2$ are provided to flip-flops 11 and 13. Hold time violations also occur on external input connectors to internal register timing paths when these paths are smaller than the clock latency, defined as the delay between the external clock connector and the register clock connector. Such a case is shown in FIG. 3a in which the delay is modeled as delay cell 16 which delays a clock signal provided to a sequential gate 18.

Generally hold time violations can be fixed, i.e. eliminated, by working on the clock network or on the clock itself. For instance, the hold time violation present in the shift register of FIG. 1A can be fixed by reducing the clock skew below the flip-flop clock-to-data output pin-to-pin timing by using a clock tree synthesis tool. Such a synthesis tool is described for example in "A Hierarchical Clock Tree Synthesizer," written by A. Ginetti et al. in "EuroAsic 94," Paris, hereinafter "document (1)". The hold time violations due to the bad clock phase difference $ck_2-ck_1$ of FIG. 2A can be fixed by revisiting the clock wave forms, or by delaying one of the clocks inside the design. The hold time violations introduced by the too long clock latency can be overcome by using a very fast clock tree (see document (1)) or by using a giant pad buffer or even by using a PLL (Phase Locked Loop). Unfortunately all these solutions have their limitations: for instance, it is impossible to decrease the clock skew below a certain level, or some giant pad buffers are too slow to drive thousands of flip-flops, and PLL are not always available.

Figure 1B:
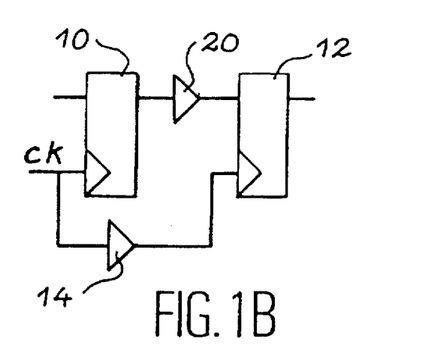
Figure 2B:
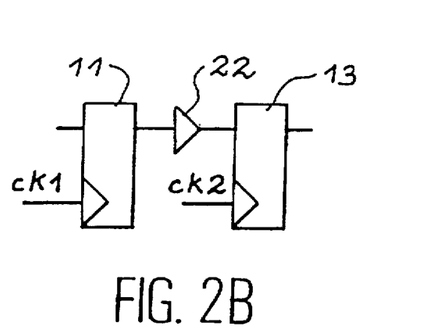
Figure 3B:
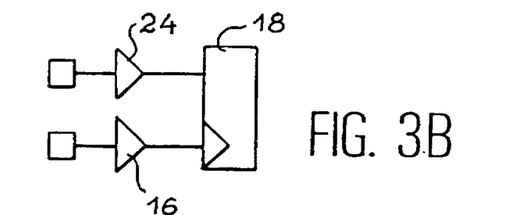

Hold time violations can also be fixed by working on the data signals, or more exactly by slowing down these data signals: for instance, the hold time violation introduced by the clock skew in the shift register of FIG. 1A can be fixed by slowing down the signal creating this violation. FIG. 1B shows an example in which the violation is fixed by a delay cell connected between the data output connector of flip-flop 10 and the data input connector of flip-flop 12. The same solution applies for fixing the hold time violation present in the multiphase design of FIG. 2A and the one introduced by the big clock latency 16 in the case of FIG. 3. As shown in FIGS. 2B and 3B delay cells 22 and 24 have respectively been introduced in the designs of FIGS. 2A and 3A.

For a better understanding of the following sections, the meaning of a timing constraint is hereafter briefly explained.

A timing constraint is a way to specify a delay between nodes in a design. The specified delay can be a minimum delay or a maximum delay. When the specified delay is a minimum delay, one speaks of minDelay timing constraint or lower-bounded timing constraint. When the specified delay is a maximum delay, one speaks of maxDelay timing constraint or upper-bounded timing constraint.

More accurately, a maxDelay timing constraint is composed of:

a set of input nodes;

a set of output nodes;

for each input node, a signal maximum arrival time, that is the latest time at which the signal is available on that node;

for each output node, a signal maximum required time, that is the latest time at which the signal should be available on that node; and, a minDelay timing constraint is composed of:

a set of input nodes;

a set of output nodes;

for each input node, a signal minimum arrival time, that is the earliest time at which the signal is available on that node;

for each output node, a signal minimum required time, that is the earliest time at which the signal should be available on that node.

Timing constraints are used for at least the two following reasons:

for checking that a design meets certain performance requirements;

for guiding performance driven optimization tools.

Checking a timing constraint consists in propagating timing constraint input node arrival time along the design and comparing the value of the propagated time and the required time on the output node. For maxDelay timing constraint, the "slack" is defined as the difference between the required time and the arrival time. For minDelay timing constraint, the "slack" is defined as the difference between the arrival time and the required time. A design is said to be violating a timing constraint when at least one of the timing constraint output node slack is negative. The worst path of a timing constraint is the path ending on the timing constraint output node the slack of which is the smallest. Guiding a performance driven optimization tool consists in providing it with the user design and timing constraints and asking said tool to optimize the design in order to meet these timing constraints.

ORIGIN OF TIMING CONSTRAINTS

Timing constraints have many origins, some of which are listed below:

the environment world of a design usually imposes arrival times on external input connectors and required times on output connectors;

the clock frequency and phase usually imposes arrival times on sequential element data output and required time on sequential element data input connectors;

a desired clock latency usually imposes arrival times (respectively required times) on the clock network input node (respectively output nodes).

CLOCKED DESIGNS

Figure 7:
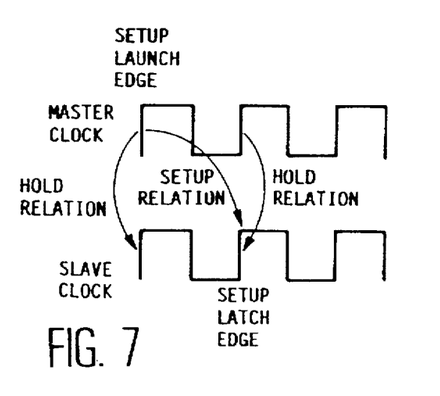

The basics of the clock-design and the definition of certain terms are to be found hereunder. In FIG. 7, where there exist some combinational paths between the flip-flop ff1 data output connector to the flip-flop ff2 data input connector, the following naming conventions are used:

ff1 will be called the master flip-flop;
ff2 will be called the slave flip-flop;
ck1 will be called the master clock;
ck2 will be called the slave clock;

the shortest combinational path between ff1 data output connector to the ff2 data input connector will be called shortest path; this path is actually composed of the ff1 ck1-to-q timing plus the combinational path minus the ff2 hold time;

the longest combinational path between ff1 data output connector to the ff2 data input connector will be called the longest path; this path actually is composed of the ff1 ck1-to-q timing plus the combinational path plus the ff2 set-up time.

A launch edge is an active edge of the master clock and a latch edge is an active edge of the slave clock.

Set-up check

Figure 4:
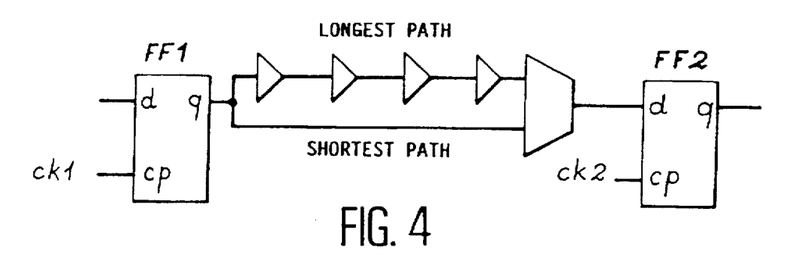
Figure 5:
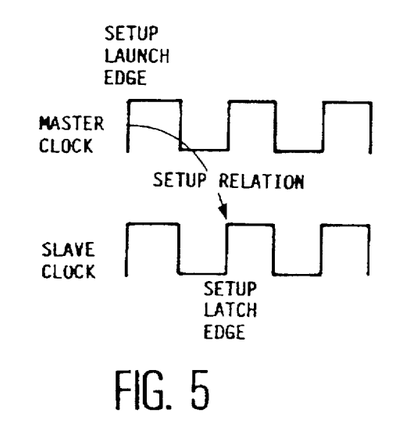
Figure 6:
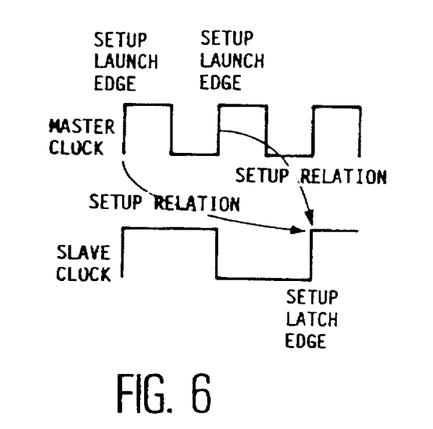

The set-up check checks set-up relations between pairs of flip-flops; a set-up relation tells that the correct data signal value is stable on the slave flip-flop in time to be properly latched. A set-up relation thus determines one set-up launch edge among the list of the launch edges and one set-up latch edge among the list of latch edges. The difference between the set-up latch edge and set-up launch edge implies a maximum delay constraint for the longest path starting on a master flip-flop and ending on a slave flip-flop. In the case of a single-frequency design (see FIG. 5), the set-up relation is simple: it tells that the longest path between a pair of flip-flops clocked on the same clock should be smaller than the clock period. In the case of a multi-frequency design (see FIG. 6), such as the one presented on FIG. 4, there may be more than one set-up relation between the same pair of flip-flops.

In this case, the set-up check first searches for the smallest difference between the set-up latch edges and the set-up launch edges. It then checks that the longest path is smaller than said difference.

Hold check

To guarantee a good design behaviour, hold relations are checked throughout the different set-up relations detected by the set-up check as follows:

a data fired by the master clock active edge that follows the set-up launch edge must not be latched by the set-up latch edge;

a data fired by the set-up launch edge must not be latched by the slave clock active edge that precedes the set-up launch edge.

Figure 8:
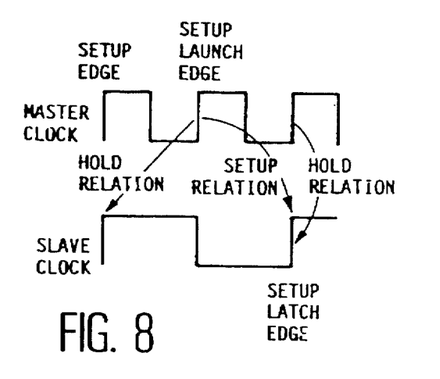

The most restrictive hold relation makes it possible to define the hold launch edge and the hold latch edge respectively as the master clock active edge and the slave clock active edge creating the hold relation. In turns, the difference between the hold latch edge and the hold launch edge implies a minimum delay constraint for the shortest path starting on a master flip-flop and ending on a slave flip-flop. FIG. 7 shows the hold relations on a single frequency design. FIG. 8 presents the hold relation on a multifrequency design.

Multicycle clock

Sometimes, for some pairs of flip-flops, the designer wants to relax the default maximum and minimum delay value, automatically detected by the default set-up and hold checkers. Multicycling a clock is a general mechanism making it possible to escape the default detected set-up edge and to re-define a chosen edge. More accurately, multicycling a clock allows one to specify:

a set-up multiplier which usually is the number of slave active edges to be added to the default set-up latch edge for set-up checking; the clock is not multicycled, the default number is obviously one. To sum up, setting a set-up multiplier of "n" consists in pushing forward the set-up latch edge by an amount of "n−1" slave clock cycles. The set-up multiplier can also be specified as the number of master active edges to be removed from the default set-up launch edge. In this case, setting a set-up multiplier of "n" consists in pushing backward the set-up launch edge by an amount of "n−1" master clock cycles;

a hold multiplier which usually is the number of master active edges to be added to the default detected hold set-up edge. The default number is zero, whether the slave clock is multicycled or not. To sum up, setting a hold multiplier of "n" consists in pushing forward the set-up launch edge by an amount of "n" master clock cycles. The hold multiplier can also be specified as the number of slave active edges to be removed from the set-up latch edge; in this case, setting a hold multiplier of "n" consists in pushing backward the set-up latch edge by an amount of "n" slave clock cycles.

Figure 9:
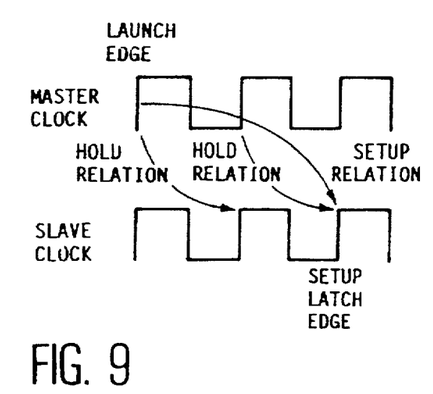
Figure 10:
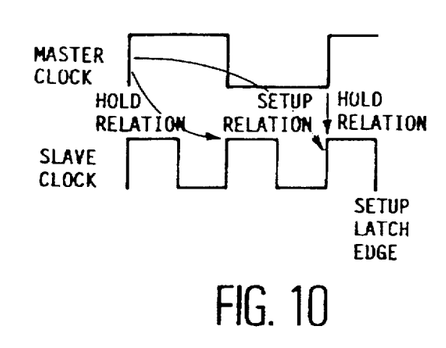
Figure 11:
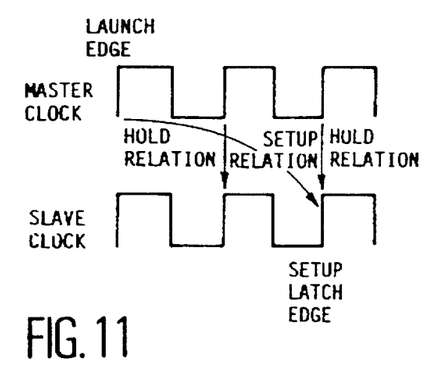
Figure 12:
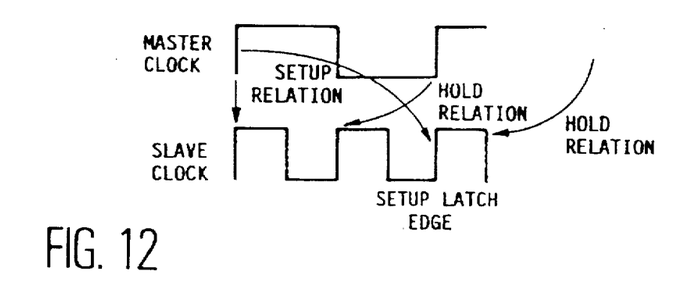

FIG. 9 presents a single frequency design with a set-up multifrequency design of two (slave clock active edges) and a hold multiplier of zero on the slave flop. FIG. 10 presents a multifrequency design with a set-up multiplier of two slave clock active edges) and a hold multiplier of zero (master clock active edges) on the slave clock.

In this example, while the maximum delay constraint introduced by the set-up relation is underconstrained, a minimum delay constraint which was not previously existing is actually created. In case the previously defined shortest path is smaller than this minimum delay, the hold check will report an error, while a synthesis tool will try to fix said error by slowing down the shortest path. But it is well known that some flip-flops will often be disabled. For instance, in the case of the single frequency design, if both the master and the slave flip-flops are disabled on the second active edge, the user can tell it to the hold checker by specifying a hold multiplier of one (see FIG. 5A and 5B). In the case of the multi-frequency design, if the user knows that the slave flip-flop is disabled on the second active edge of the slave clock, he may also tell it to the hold checker by setting a hold multiplier of one.

SPECIFYING TIMING CONSTRAINTS

The common way of specifying a timing constraint is filling four lists:

a list of input node names;

a list of input node arrival times;

a list of output node names;

a list of output node required times.

This is acceptable for specifying external arrival and required times on designs having a small number of connectors. As soon as the design contains hundreds of connectors, wild cards are requested to match in one statement a complete list of nodes. In case the user wants to set a constraint coming from a clock declaration, this is no longer acceptable for the two following reasons:

the list of nodes to be specified is "design-specific", i.e. the list of nodes contains the names of the sequential element clocked on the clock. It is unlikely that the user will be able to specify the complete list of all these sequential elements without omitting one;

the list of nodes to be specified is "technology specific", i.e. the list of nodes contains the name of the data connector of the sequential elements, like "q", "qn", "d", "da", "db", "s".

Timing constraints applied to designs are usually upper-bounded or lower-bounded. The hold time violations are clearly due to lower-bounded timing constraints introduced by the clock specification, which are clock period, wave form, skew and latency. Another type of lower-bounded timing constraint is the between node-minimum-delay specification. The set-up time violations are due to upper-bounded timing constraints introduced by the clock specification, which are equally clock period, wave form, skew and latency. Another type of upper-bounded timing constraint is the between-node-maximum-delay-specification. In the following, the phrase "fixing hold time violations" should thus be understood as "fixing lower-bounded timing constraints".

When fixing upper-bounded timing constraints, the timing is usually checked within worst case conditions, that are a derating factor bigger than "1", over-estimated predictive wiring capacitances and so on. When fixing lower-bounded timing constraints, the timing is checked within best case conditions, that are a derating factor smaller than "1", under-estimated predictive wiring capacitance and so on.

In known implementation methods upper-bounded timing constraints are usually fixed by logic synthesis tools by applying efficient performance driven tree tilling technology mappings. See "DAGON: Technology Binding and Local Optimization by DAG Matching," by K. Keutzer in "24th Design Automation Conference," pp. 341–346, hereinafter "document (2)"; "A Timing Optimizer for Hierarchical Designs," by A. Ginetti et al. in "EDAC 93", Feb. 22–25 1993, Paris, hereinafter "document (3)"; and "Using Logic Duplication to Optimize the Timing of Mapped Circuits," by A. Ginetti in "EDAC 92," Brussels, p. 559, hereinafter "document (4).".

The lower-bounded timing constraints are fixed together with the upper-bounded timing constraints.

An advantage of fixing the lower-bounded timing constraints together with the upper-bounded timing constraints clearly is that delay cells will be inserted in order not to create or increase upper-bounded timing violations.

Nevertheless, the fact of fixing lower-bounded timing constraints together with the upper-bounded timing constraints, as is usually done in commercial synthesis tools, is really impractical on differents aspects.

On the one hand, tree tilling technology mappings are difficult to extend to take into account of lower bounded timing constraints, and difficulties do appear in taking into account worst case an best case conditions at the same time. On the other hand, it would have drastic implications on tree tilling algorithm cpu time.

The main drawback of the known synthesis tools is that delay buffers are inserted haphazardly in the circuit design. It is thus quite impossible for a user to locate them.

An object of the present invention is therefore to provide a tool for automatically fixing hold time violations in hierarchical electronic designs without the above described drawbacks.

Another object of the present invention is to provide a time violations fixing process which works with best condition cases.

SUMMARY OF THE INVENTION

In order to achieve the above objects and aims, the invention concerns a computer implemented process for fixing hold time violations in hierarchical designs of electronic circuits. The process comprises the steps of:

1) synthetizing a RTL-HDL type description of the circuit to form a synthesized design, 2) synthetizing a clock tree and adding it to the synthesized design produced in step 1, 3) optimizing the synthesized design resulting from step 2 and fixing upper-bounded timing constraints by using a real clock timing (latency and skew) and worst case conditions, 4) fixing lower bounded timing violations in the optimized synthesized design resulting from step 3, using a real clock timing, using best case conditions, 5) re-fixing possible newly created upper-bounded timing constraints and possible upper-bounded timing constraints increased in step 4, 6) fixing post-layout upper-bounded timing violations.

A computer for fixing hold time violations in hierarchical designs of a circuit comprises the following tools:

a logic optimizer, for fixing upper-bounded timing violations of the circuit and optimizing an area of said circuit, a clock tree synthesizer, (see document (1)), a lower-bounded timing violation fixer, a post-layout upper-bounded timing violation fixer.

Concerning the post-layout timing violation fixer, reference is made to "Post-Placement Technology Mapping," by D. Brasen et al. in "VLSI 93," Sep. 6–10 93, Grenoble.

DETAILED DESCRIPTION OF THE INVENTION

The method of the invention mainly consists in fixing lower-bounded timing constraints in a process which is separate from the process fixing the upper-bounded timing constraints. This separate process instantiates delay cells in order to slow down the signal creating hold time violations. The synthesized delay cells are actually two-connector-hierarchical cells composed of a buffer chain.

Figure 13:
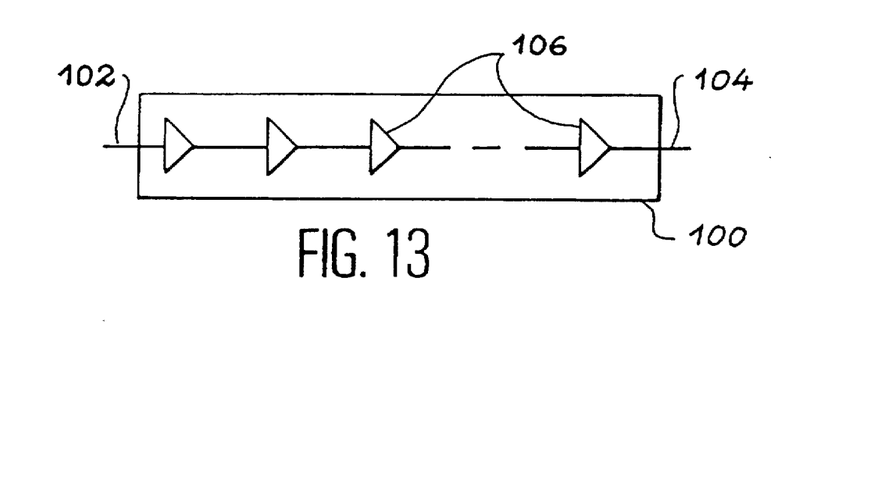

FIG. 13 shows an example of a synthesized hierarchical delay cell. The hierarchical cell 100, or so called buffer chain, comprises, between an input connector 102 and an output connector 104, a number of delay cells 106 corresponding to the time at which the signal is to be slowed down.

The synthesized hierarchical delay cell is then inserted in the original circuit design.

Figure 14:
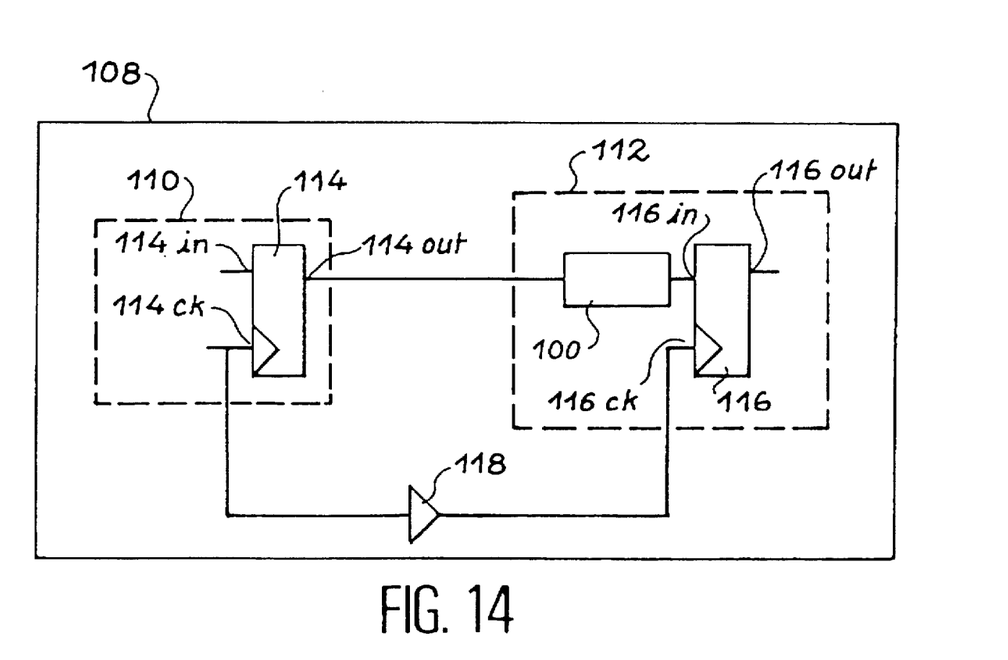
FIG. 14, is a diagrammatic view of a circuit and shows how the synthesized delay cell may be inserted in an original hierarchy design of circuit.

FIG. 14 gives an example of such a circuit design 108 with two hierarchical parts or subcells 110, 112.

Each subcell 110, 112 comprises a flip-flop respectively bearing the references 114 and 116. The input connectors, the output connectors and the clock connectors of the flip-flops 114 and 116 respectively bear references 114in, 116in, 114out, 116out, 114ck and 116ck.

A delay element 118 connected between the connectors 114ck and 116ck corresponds to a clock skew which is bigger than a clock-to data output, connector-to-connector of the flip-flops 114 and 116. This delay element 118 causes a hold time violation in the original circuit comprised of subcells 110 and 112.

This case corresponds to the above explained case of FIG. 1.

A hierarchical delay cell 100, comprising one or a plurality of delay cells is introduced in the design according to the invention. It is inserted between connectors 114out and 116in. The delay value of the hierarchical delay cell is calculated as described hereafter.

The lower-bounded timing violation fixer algorithm according to the invention fixes one by one the violations with a smallest possible buffer chain 100 (in the case of FIG. 14, the single violation). It takes into account of predictive wiring capacitance, derating factors, and design rules such as maximum ramp delay through cells. It can be extended to also take into account physical information such as physical wire cap, physical resistor-capacitor delay and flexible delay mode gate timing.

The lower bounded timing violation fixer can be computer implemented with the following algorithm:

procedure synthesize-best delay-cell(node):
  while nodeIsOnTheCriticalPath(node) do begin
    add-best-buffer ( );
    extract-critical-path ( );
    end;
  end;
procedure fix-hold-time-violations ( );
  while there-are-hold-time-violations ( ) do begin
    extract-critical-path ( );
    find-best-location-to-slow-down-the-signal (node);
    synthesize-best-delay-cell (node);
    end;
  end;

The complete synthesis flow comprises the under mentioned steps.

A first step is to synthesize a "Register Transfer Logic" (RTL) description of the circuit in a "Hardware Description Language" (HDL).

A further step is to synthesize a clock tree of the circuit. This synthesis may be based on the RTL HDL Description. The synthesized clock-tree is then added to the previously synthesized description of the circuit. More information about clock tree synthesizers can be found in the document (1).

A further step is to optimize the whole synthesized design according to a known method and to fix the upper bounded timing constraints using a real clock timing (latency and skew) and worst case conditions. As an example, we could refer to document (3)

The real clock timing means takes into account the latency and the skew of the clock during the optimization.

The worst case conditions are to be understood as the condition where the gates are slow because of environment conditions such as high temperature and low voltage.

A further step is to fix the lower-bounded timing violations of the optimized synthesized design using the real clock timing and best case conditions.

Contrary to worst case conditions, best case conditions are to be understood as conditions such as a low temperature and a high voltage.

In the case the lower-bounded timing violations fixing step creates or increases the upper-bounded timing constraints, the process further comprises a step of re-fixing these new violations. Whilst re-fixing the violations, the synthesized hierarchical delay cells are kept frozen.

A last step of the process comprises a fixing of post-layout upper-bounded timing violations. This step may comprise light modifications of the design after placement (after layout). For example, an upper-bounded timing violation due to a big wiring, introducing a big capacity after a given cell (or gate), may be fixed by swapping the said cell by an equivalent cell (or gate) with a stronger output driver and having thus better timing characteristics.

The method according to the invention has a lot of advantages. Among these, is the fact that the buffers, or the delay cells can be instantiated in creating sub-levels of hierarchy. Thanks to this feature it is easy to locate the delay cells and even to edit these delay cells for example for a manual post-layout fine timing. It is also possible and easy to detect and to freeze the delay cells instantiated in a sub-level of hierarchy for a further optimization and/or a further edition. These cells may also be frozen in order to add or to remove buffers.

In other respects, the algorithm can be re-used for other goals, for instance for a latency matching clock tree in hierarchical designs.

Other advantages of the invention consist in the minor and local modifications of the design of the circuit that it only induces, in the fact that the algorithm is coupled with a clock tree synthesizer, and that the delay chains are synthesized by a novel algorithm minimizing their area and thus the global area of the circuit.

The hold time violation fixing method according to the invention works with best conditions especially because it is separated from the upper-bounded timing constraints optimization process.

Figure 15:
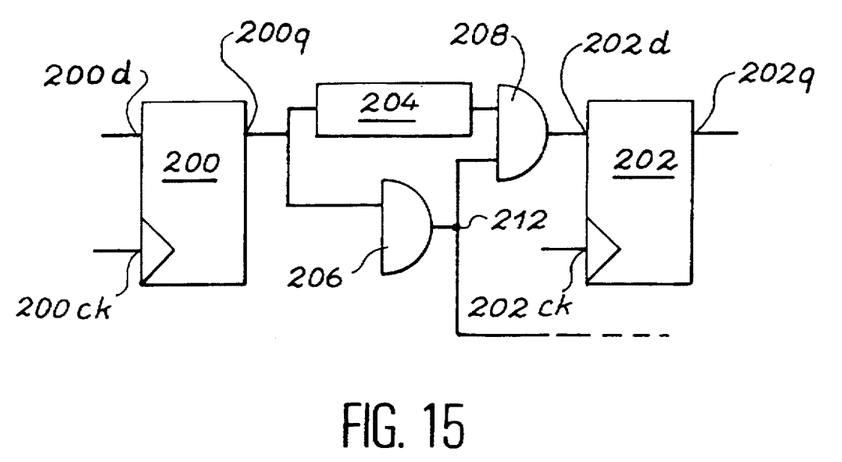
FIGS. 15 and 16 are diagrammatic views of a circuit with a critical path and show, as an example, how to find the best location for a synthesized delay cell.
Figure 16:
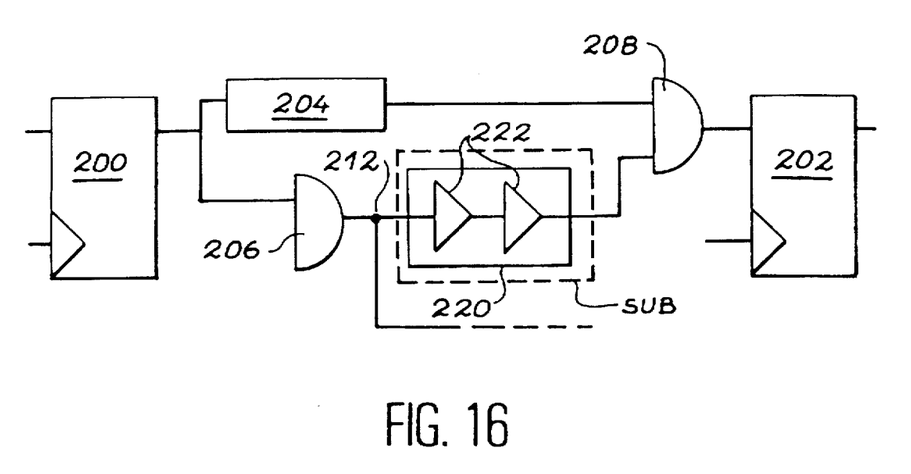

The FIGS. 15 and 16 show, by way of example, how and where a synthesized delay cell is located in a given circuit, according to the invention.

The circuit shown in FIG. 15 comprises two flip flops 200, 202, each having an input 200d, 202d, an output 200q, 202q and a clock connector 200ck, 202ck.

A signal output at the connector 200q may reach the connector 202d via two different paths. In a first path the signal crosses a group of gates referenced 204 and an (AND) gate 208. In the second path, the signal only crosses an (AND) gate 206 and the gate 208. The output connector of the gate 206 is connected to an input of the gate 208 and to a (not shown) further section of the circuit via a node 212.

Between the flip flops 200 and 202 a maximum and a minimum time constraint can be defined. A signal output at the connector 200q has to reach the connector 202d not before a first given delay and not after a second given delay, whatever the paths between these connectors it crosses.

As an example let us suppose that such a signal has to reach the connector 202d, between 10 and 20 ns (nanoseconds) after having been output at 200q.

Let us also suppose that the signal crossing the first path i.e. the gate group 204 and the gate 208 reaches the connector 202d after 19 ns and that the signal crossing the second path, i.e. the gates 206 and 208 reaches the connector 202d after 7 ns only.

In this case, there is a time violation for a signal crossing the second path and an appropriate delay cell or buffer chain has to be located in the circuit in order to slow down the signal. In fact the signal is slowed down on the input connector of (a) critical gate(s) driven by the first multi-fanout critical gate encountered in a backward propagation from the latch edge, i.e. from the connector 202d.

In the case of the circuit shown at FIG. 15 the driven critical gate is the gate 208 and the multi-fanout critical gate is the gate 206. So, a delay cell has, as shown in FIG. 16 to be located after the node 212, between the gates 206 and 208.

In the circuit of FIG. 16 a buffer chain 220 with two delay cells 222 has been located between node 212 and gate 208. This buffer chain introduces for example a delay between 3 and 13 ns in order to fit with the time constraints.

One skilled in the art will easily understand that this location is the best one. If the buffer chain had been located before the input of gate 206 or before node 212, it would also have fixed the time violation but it might have created further violation in the not shown circuit which is also connected to node 212.

As shown with a dotted line the buffer chain is introduced in the design in a sub-level of hirearchy.

We claim:

1. A computer implemented process for fixing hold time violations in a hierarchical design of an electronic circuit, said process comprising the steps of:

1) synthesizing a RTL-HDL type description of the circuit to form a synthesized design, 2) synthesizing a clock tree and adding it to the synthesized design produced in step 1, 3) optimizing the synthesized design resulting from step 2, and fixing upper-bounded timing constraints by using a real clock timing and worst case conditions, 4) fixing lower-bounded timing violations in the optimized synthesized design resulting from step 3, using a real clock timing, using best case conditions by introducing at least one buffer in the hierarchical design for fixing said lower-bounded timing violations separately from said upper-bounded timing constraints as a sub-level of the hierarchical design, 5) re-fixing possible upper-bounded timing constraints newly created and possible upper-bounded timing constraints increased in step 4, and 6) fixing post-layout upper-bounded timing violations.

2. A computer implemented process according to claim 1 in which in step 4, the real clock timing and best conditions are specified by an user.

3. A computer implemented process for fixing hold time violations according to claim 1 wherein the buffer chains are as small as possible.

4. A computer implemented process according to claim 1 further comprising a step of:

executing a lower-bounded timing violation fixer computer program which includes as program steps:

```
procedure synthesize-best delay-cell (node):
            while nodeIsOnTheCriticalPath (node) do
begin
    add-best-buffer ( );
    extract-critical-path ( );
            end;
    end;
procedure fix-hold-time-violations ( );
            while there-are-hold-time-violations ( ) do
begin
    extract-critical-path ( );
    find-best-location-to-slow-down-the-signal (node);
    synthesize-best-delay-cell (node);
            end;
    end;.
```

5. A computer implemented process according to claim 1, in which in step 4 said at least one buffer is inserted in a data line of said circuit.

6. A computer for fixing hold time violations in a hierarchical design of a circuit comprising:

a logic optimizer, for fixing upper-bounded timing violations by introducing buffer chains in the hierarchical design in a sub-level of the hierarchical design of the circuit and optimizing an area of said circuit, a clock tree synthesizer, a lower-bounded timing violation fixer for fixing lower bounded timing violations separately from said upper-bounded timing constraints, and a post-layout upper-bounded timing violation fixer.

7. A computer for fixing hold time violations in hierarchical designs according to claim 6, wherein said at least one buffer is inserted in a data line of said circuit.

* * * * *